United States Patent [19]

Kraus et al.

[11] 4,359,519

[45] Nov. 16, 1982

[54] PROCESS FOR FORMING A HIGH RESOLUTION RECORDING MEDIUM

[75] Inventors: Heinz Kraus, Traunreut; Erich Bayer, Trostberg, both of Fed. Rep. of Germany

[73] Assignee: Dr. Johannes Heidenhain GmbH, Traunreut, Fed. Rep. of Germany

[21] Appl. No.: 116,494

[22] Filed: Jan. 29, 1980

[30] Foreign Application Priority Data

Jan. 31, 1979 [DE]  Fed. Rep. of Germany ....... 2903641

[51] Int. Cl.$^3$ .................... G03C 5/00; G03C 7/00; G02B 5/28; B44F 1/08
[52] U.S. Cl. ..................................... 430/321; 156/636; 156/637; 156/639; 156/640; 156/643; 156/659.1; 156/661.1; 428/195; 428/913; 430/8; 430/293; 430/294; 430/323; 430/324; 430/329
[58] Field of Search ............... 156/636, 637, 640, 639, 156/643, 659, 661, 659.1, 661.1; 428/195, 913; 430/323, 324, 320, 321, 8, 293, 294, 292

[56]  References Cited

U.S. PATENT DOCUMENTS

| | | | |
|---|---|---|---|
| 3,521,961 | 7/1970 | Heidenhain et al. | 356/170 |
| 3,824,100 | 7/1974 | Griest | 430/5 |
| 3,891,440 | 6/1975 | Gallaro et al. | 313/472 X |
| 3,971,874 | 7/1976 | Ohta et al. | 428/432 |
| 4,019,905 | 4/1977 | Tomita et al. | 427/68 X |
| 4,026,743 | 5/1977 | Berezin et al. | 156/653 |
| 4,151,321 | 4/1979 | Hiesinger | 428/195 |
| 4,258,126 | 3/1981 | Hiesinger | 430/321 |

FOREIGN PATENT DOCUMENTS 902713 10/1955 Fed. Rep. of Germany .
697036  9/1953 United Kingdom .

OTHER PUBLICATIONS

IBM Tech. Disclosure Bulletin, vol. 15, No. 5, Oct. 1972, Making Iron Oxide Masks.
Kodak Publication, p. 131, "Chemical Milling with Kodak Photosensitive Resists", 1968, pp. 15, 18.

*Primary Examiner*—Charles L. Bowers, Jr.
*Attorney, Agent, or Firm*—Hume, Clement, Brinks, Willian & Olds, Ltd.

[57] ABSTRACT

A process for forming a high resolution recording medium including at least a high resolution, patterned interference filter formed from at least two reflecting layers separated by an interference layer including the step of removing patterned portions of a reflective layer not protected by a photosensitive layer by means of chemical etching or ion beam etching. When chemical etching is used, the etching process is accelerated to reduce under-etching by maintaining a rapid, thorough, and continuous boundary surface exchange of the etching solution at the boundary between the etching solution and the reflective layer being etched.

2 Claims, 1 Drawing Figure

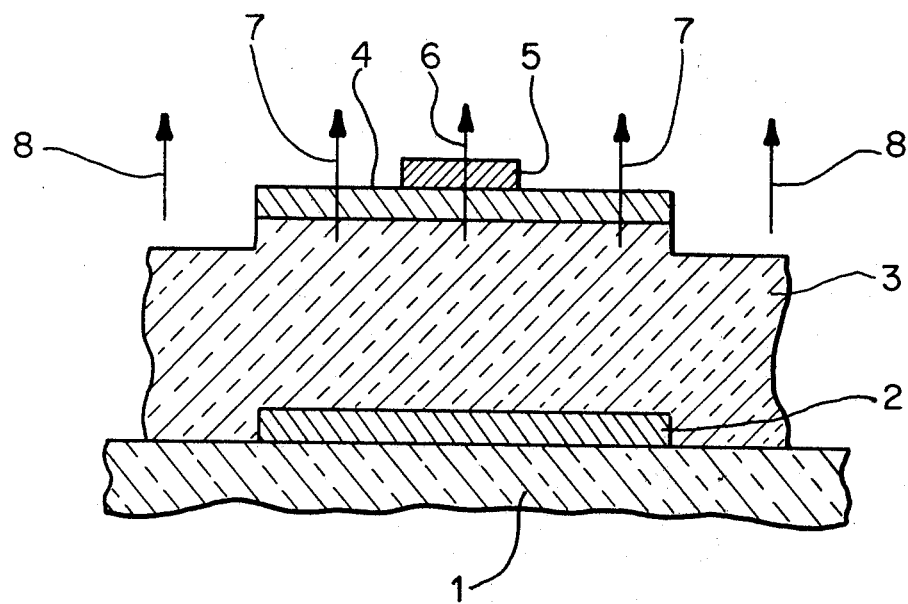

PROCESS FOR FORMING A HIGH RESOLUTION RECORDING MEDIUM

BACKGROUND OF THE INVENTION

This invention relates to a process for forming a multilayered, high resolution recording medium having a plurality of reflecting layers separated by a spacing layer.

As disclosed in West German DT-OS No. 26 58 623, high resolution, multicolored recording media can be formed by means of multiple, carefully formed reflecting layers separated by a translucent spacing layer. According to the teaching of this patent specification, the reflecting layers are formed by means of a high frequency sputter etching process. In this process a substrate is exposed to a high vacuum in a vacuum apparatus and then coated by means of a cathode formed of a material such as silver which is suitable for the generation of reflecting layers. Thereupon, the reflecting layer is coated with a photosensitive layer and the photosensitive layer is exposed through a patterned exposure mask. After the unexposed pattern portion of the photosensitive layer has been removed, the patterned portion of the reflecting layer not covered with the photosensitive layer is then removed by ion bombardment with reversed polarization.

The process disclosed in DT-OS No. 26 58 623 presents the disadvantage that in addition to the ions responsible for the material removal there also arise high energy electrons. During the removal process, these energy-rich electrons often bring about a chemical alteration of the remaining photosensitive layer in the form of a hardening of the photosensitive layer by cross-linking. The hardened photosensitive layer is not removable in the form of a true solution as is the photosensitive layer prior to hardening. When the hardened photosensitive layer is immersed in solvent it tends to swell rather than dissolve, and the removal of the photosensitive layer often has to be initiated by mechanical means such as ultrasound or wiping techniques. On many occasions, such techniques may damage the underlying remaining reflecting layer, which is quite thin and easily damaged, often having a thickness of only a few atomic layers. During the production process such a removal of the remaining photosensitive layer is required several times, and the spoilage rate can therefore climb appreciably.

SUMMARY OF THE INVENTION

The present invention is directed to an improved process for the production of a high resolution recording medium that avoids the disadvantages mentioned above.

According to this invention, chemical etching techniques or ion beam etching techniques are used to remove selected portions of a reflecting layer in the production of a multilayer, high resolution recording medium.

Preferably, chemical etching is performed in such a manner that a rapid and thorough boundary surface exchange of the etching agent takes place continually. This results in a substantial reduction of the under-etching which is generally characteristic of chemical etches and which would otherwise render impossible the formation of extremely high resolution patterns. In general, under-etching takes place when the edges of the photosensitive layer lift off of the underlying protected layer when the etching process takes excessively long, as for example as a result of a reduced activity of unexchanged etching agent at the boundary surfaces of the etching agent.

Adequately rapid and thorough boundary surface exchange of the etching medium can be achieved, for example, by the means that the chemical etching is carried out in a centrifuge and the etching agent is fed continuously onto the photosensitive layer as a spray jet. Tests have indicated that the quality of the pattern reproduction of such chemically etched layers in comparison to layers that were produced by high-frequency sputter etching, is substantially identical, since the under-etching occurring in the preferred chemical etching process can be kept less than 0.1 microns.

An alternate process for removing patterned portions of a reflecting layer not covered with a photosensitive layer is by means of ion beam etching. In this etching process the electrons present in the plasma discharge are prevented by application of suitable electric or magnetic fields from reaching the surface of the remaining photolac layer. In this manner the removal process does not cross-link the photosensitive layer and the remaining photosensitive layer can therefore be removed from the reflecting layer by means of solvents.

For example, with a five color recording medium the chemical etching process and the ion beam etching process can successfully be applied to the following steps as listed below:

| Color | Layer to be removed | Removal process |
| --- | --- | --- |
| Black | Cr | Strip process |
| Red I | $Fe_2O_3$ | Chemical etching or ion beam etching |
| Green | Ag | Chemical etching or ion beam etching |
| Green and red II | Ag | Chemical etching or ion beam etching |
| Blue | Ag | Chemical etching or ion beam etching |

In a production process which utilizes the proposed chemical etching process there can be carried out the following process steps successively in a wet process on a centrifuge:

(1) Developing the exposed patterned portion of the photosensitive layer;

(2) Removing the patterned portion of the reflecting layer no longer covered with the photosensitive layer by chemical etching;

(3) Removing the remaining photosensitive layer by a solvent; and (4) Cleaning the partially fabricated medium for the following process step.

Important advantages achieved with the present invention include the following:

(1) In the removal of the patterned portion of the reflecting layer the remaining photosensitive layer is not chemically altered by the proposed process of chemical etching or of ion beam etching. The remaining photosensitive layer can therefore be removed by dissolving it in a solvent without mechanical action, so that there is achieved a substantial reduction of scratching or otherwise disturbing the remaining reflecting layer.

(2) The chemical etching process of this invention makes possible a spatial and temporal summarization of process steps, so that besides a considerable saving in time the risk of transport and fouling can be reduced. Further, the capital expenditure is relatively low.

(3) In the ion beam etching no under-etching occurs; in the chemical etching with boundary surface exchange of the etching agent the under-etching can be kept less than 0.1 microns, so that in both etching processes very sharp pattern edges can be achieved.

The invention, together with further objects and attendant advantages, can best be understood by reference to the following detailed description taken in conjunction with the accompanying drawing.

BRIEF DESCRIPTION OF THE DRAWING

The drawing shows a cross-sectional view of a portion of a recording medium produced by a preferred embodiment of the process of this invention.

DETAILED DESCRIPTION OF PREFERRED EMBODIMENTS

In the FIGURE there is represented a portion of a recording medium produced by a preferred embodiment of the process of the present invention. This medium includes a transparent substrate layer 1 of glass to which is applied a reflecting layer 2 of silver. The layer 2 of silver is coated with a photosensitive layer (not represented), which is then exposed in the desired pattern by means of an exposure mask and thereafter developed. The portion of the reflecting layer 2 under the removed photosensitive layer is then removed by chemical etching or by ion beam etching. The remaining photosensitive layer is then removed and an interference layer 3 of uniformly thick inorganic material absorption free in the visible wavelength range is then applied to the structure-carrying side of the substrate 1. A reflecting layer 4 of silver is then applied over the interference layer 3, and the layer 4 is then coated with a photosensitive layer (not represented). The photosensitive layer is exposed in the desired pattern by means of an exposure mask and thereafter developed. The portion of the reflecting layer 4 no longer covered with the photosensitive layer is then removed by chemical etching or by ion beam etching. After removal of the residual photosensitive layer another reflecting layer 5 of silver is applied, which is patterned by application of a photosensitive layer (not represented), patterned exposure, development of the photosensitive layer and removal of chemical etching or ion beam etching of the patterned portion of the reflecting layer 5 no longer covered with the photosensitive layer.

When chemical etching is used a rapid and thorough boundary surface exchange of the etching medium is continuously maintained. In the preferred embodiment, the photosensitive layer is the photolac material distributed by Shipley as part number 1350. The etching agent is a solution of 1% nitric acid or 50% iron nitrate. The solvent of the photosensitive layer is dimethyl formamide or a keytone. Preferably, the chemical etching is performed in a centrifuge which spins the part being etched at about 600 revolutions per minute. The part being etched can have a diameter up to about 350 millimeters and is maintained in a horizontal position. The chemical etching solution is sprayed onto the part being etched at the center of rotation of the part at a flow rate of about 150 millimeters/minute. The rotary motion of the part being etched causes the etching solution to move across the surface of the part. This ensures that a rapid, thorough and continuous exchange of the boundary layer of the etching solution occurs and allows the etching step to be completed in about 40 to 60 seconds.

When ion beam etching is used a device such as the Micro Ion Mill (MIM-TLA 5.5), distributed by the Technics Corporation, Alexandria, Va., is preferably employed. This device includes means for substantially preventing high energy electrons from reaching the remaining photosensitive layer. This greatly reduces cross linking of the layer and facilitates later removal of this layer with solvents.

The recording medium produced in this manner presents a structure having a color, blue in this example, which is determined by the thickness of the interference layer 3. The color saturation of this color is determined in the zone of the arrow 7 by the thicknesses of the two reflecting layers 2, 4, so that the light emerging in this zone appears "light blue". In the zone of the arrow 6 the color saturation is strengthened by the thicknesses of the two reflecting layers 2, 4 and 5 (the successively applied reflecting layers 4, 5 present a single reflecting layer), so that in this zone the emerging light appears "dark blue". In the zone of the arrow 8 the emerging light, because of the transparency of the layer 3, appears white, since in this zone no reflecting layers are present.

The layer sequences 2, 3, 4, and 2, 3, 4 and 5, form in each case an interference filter for the color "blue" with differing color saturation. By an arrangement of such interference filters adjacent to one another on a substrate there can be generated any desired color hues with any desired color saturation next to one another. By an arrangement of such interference filters one over another on a substrate there can be produced color tones by multiplicative color mixing.

Of course, it should be understood that various changes and modifications can be made to the preferred embodiments described above. Such changes and modifications can be made without departing from the spirit and scope of the present invention, and without diminishing its attendant advantages. It is therefore intended that all such changes and modifications be covered by the following claims.

We claim:

1. A process for producing a high resolution recording medium comprising the following steps:
   (a) applying a first reflecting layer of an inorganic material to a first side of a substrate;
   (b) apply a first layer of photosensitive material to the first reflecting layer; then
   (c) exposing a patterned portion of the photosensitive material and thereupon developing the photosensitive material; then
   (d) removing those portions of the first reflecting layer not covered by photosensitive material by wet chemical etching, wherein etching agent is applied to the first reflecting layer as a spray; then
   (e) removing the remaining photosensitive material; then
   (f) applying an interference layer to the first side of the substrate, said interference layer having a substantially uniform thickness and comprising an inorganic material which is substantially absorption-free in the visible range of the spectrum;
   (g) applying at least a second reflecting layer of inorganic material to the interference layer;
   (h) applying a second layer of photosensitive material to the second reflecting layer; then (i) exposing a patterned portion of the photosensitive material and thereupon developing the photosensitive layer; then
(j) removing those portions of the second reflecting layer not covered by photosensitive material by wet chemical etching, wherein etching agent is applied to the second reflecting layer as a spray; and then
(k) removing the remaining photosensitive material.

2. The process of claim 1 wherein each of the removing steps (d) and (j) includes the steps of applying an etching solution to the respective reflecting layer and maintaining a rapid, thorough and continuous boundary surface exchange of the etching solution at the boundary surface of the etching solution adjacent the respective reflecting layer to accelerate the respective removing step.

* * * * *